(12) United States Patent
Kato et al.

(10) Patent No.: US 6,272,061 B1
(45) Date of Patent: Aug. 7, 2001

(54) SEMICONDUCTOR INTEGRATED CIRCUIT DEVICE HAVING FUSES AND FUSE LATCH CIRCUITS

(75) Inventors: Daisuke Kato; Yohji Watanabe, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/652,158

(22) Filed: Aug. 31, 2000

(30) Foreign Application Priority Data

Sep. 2, 1999 (JP) .................................................. 11-249179

(51) Int. Cl.⁷ ..................................................... G11C 7/00
(52) U.S. Cl. ............................ 365/225.7; 365/51; 365/63
(58) Field of Search ................................... 365/225.7, 51, 365/52, 63; 257/529

(56) References Cited

U.S. PATENT DOCUMENTS

| | | | |
|---|---|---|---|
| 5,636,158 | 6/1997 | Kato et al. | 365/63 |
| 5,859,801 * | 1/1999 | Poechmuller | 365/225.7 |
| 6,016,265 | 1/2000 | Yoshida et al. | 365/96 |
| 6,021,061 | 2/2000 | Kato et al. | 365/51 |

FOREIGN PATENT DOCUMENTS 11-135754  5/1999  (JP).

OTHER PUBLICATIONS

Watanabe, Y. et al., "A286 mm² 256 Mb DRAM with ×32 Both–Ends DQ", IEEE Journal of Solid–State Circuits, vol. 31, No. 4, pp. 567–574, Apr. 1996.

* cited by examiner

Primary Examiner—Tan T. Nguyen
(74) Attorney, Agent, or Firm—Finnegan, Henderson, Farabow, Garrett & Dunner, L.L.P.

(57) ABSTRACT

A semiconductor integrated circuit device has a semiconductor integrated circuit with first layout sections where fuses are laid out and second layout sections where fuse latch circuits, which correspond to the fuses, are laid out. The first layout sections are disposed in a first repetition pitch in a fuse area, while the second layout sections are laid out at a second repetition pitch smaller than the first repetition pitch in a fuse latch circuit area. A third layout section is laid out in a space caused by the difference between the first and second repetition pitches. In the third layout section, at least one of patterns which are unrepeatable in each of the second layout sections and the patterns which do not need to be repeated in each of the second layout sections.

18 Claims, 16 Drawing Sheets

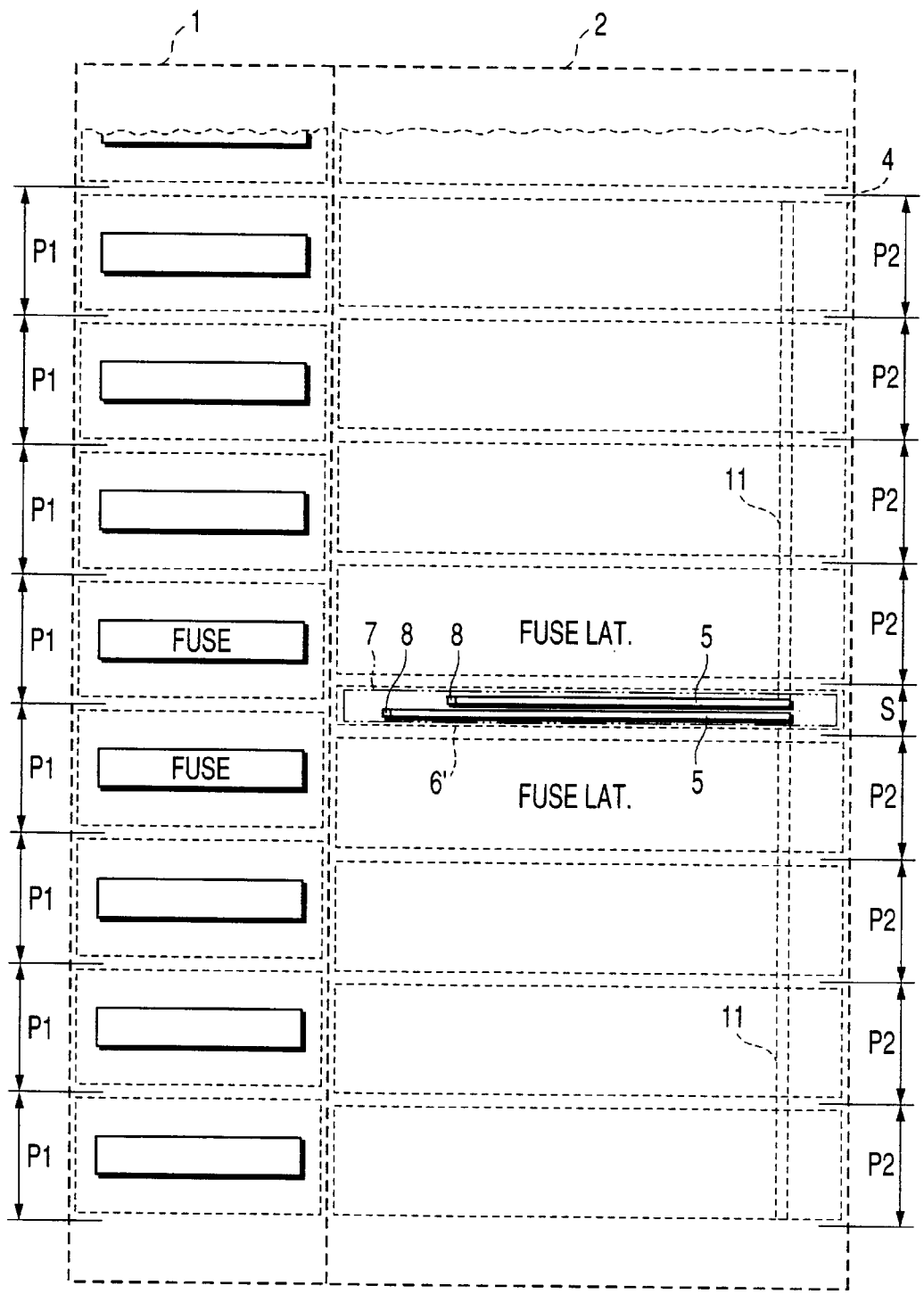
F I G. 7

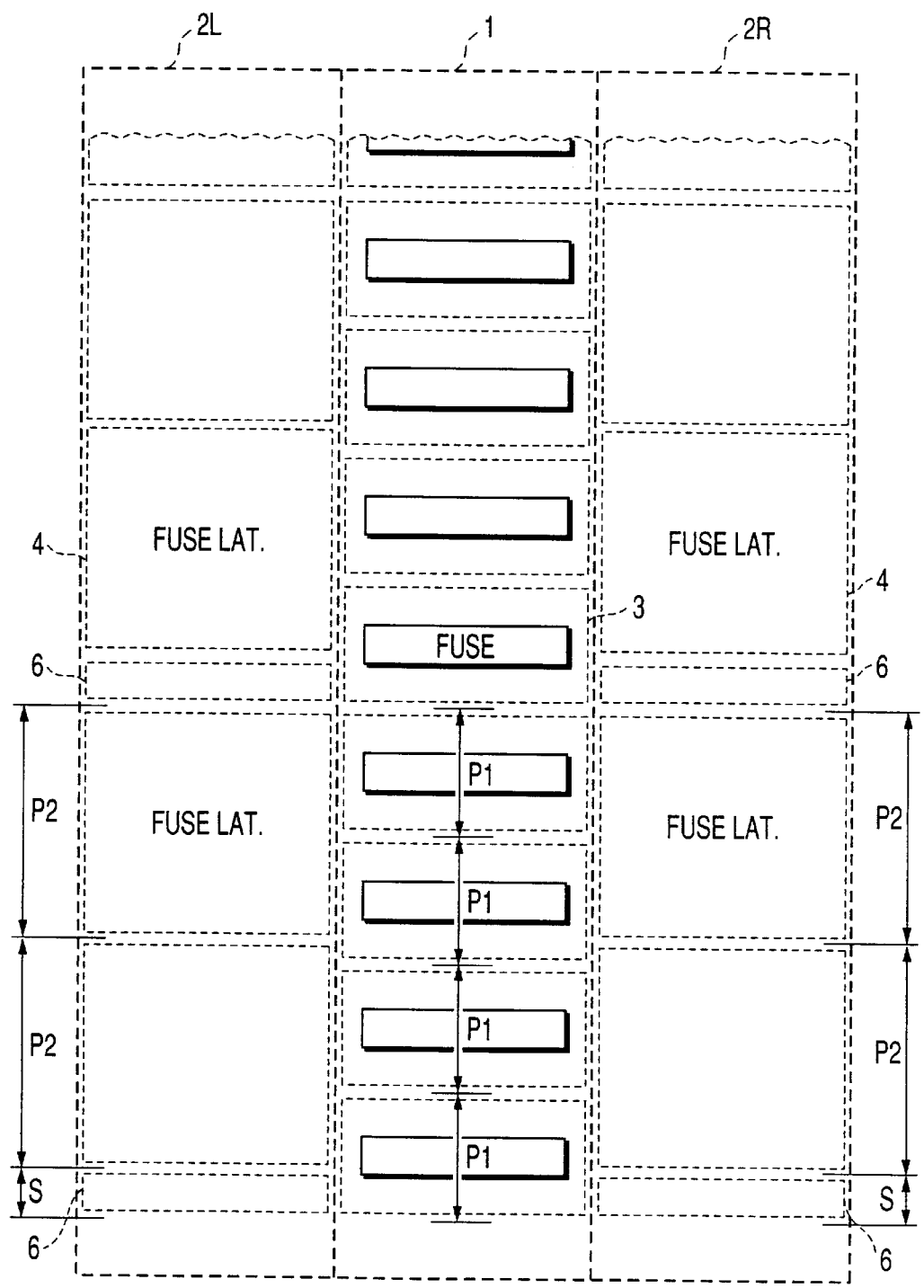
F I G. 15

| FUSE COORDINATE | 0 | 1.25 | 2.5 | 3.75 |
|---|---|---|---|---|
| SPECIFIED BLOW POINT | 0 | 1.2 OR 1.3 | 2.5 | 3.7 OR 3.8 |
| CORRECTED FUSE COORDINATE | 0 | 1.2 OR 1.3 | 2.5 | 3.7 OR 3.8 |

SEMICONDUCTOR INTEGRATED CIRCUIT DEVICE HAVING FUSES AND FUSE LATCH CIRCUITS

CROSS-REFERENCE TO RELATED APPLICATIONS

This application is based upon and claims the benefit of priority from the prior Japanese Patent Application No. 11-249179, filed Sep. 2, 1999, the entire contents of which are incorporated herein by reference.

BACKGROUND OF THE INVENTION

The present invention relates to a fuse and a fuse latch circuit, and more particularly to a layout of these fuses and fuse latch circuits.

FIG. 1 is a layout of conventional fuses and fuse latch circuits. FIG. 1 shows an example of a fuse and a fuse latch circuit, used for a redundancy circuit in semiconductor memory.

As shown in FIG. 1, the conventional fuses (FUSE) and fuse latch circuits (FUSE LAT.), which correspond one to one to the fuses, are disposed in a fuse area 101 and a fuse latch circuit area 102, which are adjacent to each other on a chip.

Basic patterns 103 and 104 are available to dispose fuses and fuse latch circuits, respectively. In the fuse area 101 and fuse latch circuit area 102, these basic patterns 103 and 104 are repeated a predetermined number of times to lay out a predetermined number of fuses and fuse latch circuits on a chip.

A repetition pitch P2 between the basic patterns 104 of the conventional fuse latch circuits is equal to a repeating pitch P1 between the basic patterns 103 of the conventional fuses. This is because equalizing the repetition pitches P2 and P1 helps connect the fuses with the fuse latch circuits, corresponding to the fuses.

In the fuse latch area 102, some basic patterns 104 can be repeatedly used for each fuse latch circuit; others are not. For example, for the fuse latch circuits used for a redundancy circuit, which are in FIG. 1, repeatable basic patterns 104 are common to a plurality of addresses, and unrepeatable patterns are for local address signal lines 105. The local address signal lines 105 connect global address signal lines disposed, for example, in the direction of repeated basic patterns 104 with the fuse latch circuits.

Different addresses could be entered for different fuse latch circuits. Because of this, a hierarchy in which a pattern of local address signal lines 105 is laid out differs from a hierarchy in which a pattern common to a plurality of addresses. Here the term "hierarchy" does not mean a "physically upper or lower level." For example, in semiconductor memory, a plurality of the same layouts are provided. Thus in a layout block (cell), another layout block is frequently disposed. Such a structure is called a "hierarchy" in a layout.

Each local address signal line 105 differs from a basic pattern 104 of fuse latch circuits in terms of hierarchy but is laid out where the basic pattern 104 is disposed.

However, such a layout increases the number of local address signal lines 105. As a result, the total parasitic capacitance of address signal lines, including global address lines, increases, thus markedly delaying address signal transmission.

To solve this problem, a semiconductor memory device is adapted so that the number of local address signal lines 105 is reduced by disposing a plurality of fuse latch circuits corresponding to the same address in a group and making the local address signal lines 105 common to the plurality of fuse latch circuits to reduce the total parasitic capacitance of address signal lines, as shown in FIG. 2 (Jpn. Pat. Appln. KOKAI Publication No. 11-135754).

However, at any rate, a local address signal line 105 differs from a basic pattern 104 of fuse latch circuits in terms of hierarchy but is laid out where the basic pattern 104 is disposed. This requires that the basic pattern 104 of fuse latch circuits is provided with a space (or an area) 106 in which local address signal lines are disposed. Because wiring in the same wiring layer as the local address signal lines 105 cannot be installed in the space, layout is restricted.

Such a restriction limits the flexibility of layout and prevents area in which fuse latch circuits are disposed from being reduced, and moreover, increases unnecessary area.

The basic pattern 104 of fuse latch circuits is repeated in a conventional fuse latch area 102 so that the patterns are close to each other, patterns which do not necessarily need to be repeated at the pitch P2 are repeated.

Such patterns are contacts to a semiconductor substrate or a well.

Also because patterns which do not necessarily need to be repeated at the pitch P2 are repeated than necessary, fuse latch circuit area reduction is prevented, or fuse latch circuit area even increases.

BRIEF SUMMARY OF THE INVENTION

It is a main object of the present invention, made in the light of the foregoing, to provide a semiconductor integrated circuit device which allows restrictions on fuse latch circuit layout to be removed and fuse latch circuit area to be minimized.

It is another object of the present invention to provide a semiconductor integrated circuit device which allows blow errors to be reduced even if the pitch of repetition of a basic pattern for a fuse is reduced to below the minimum positioning repetition pitch of a blow machine.

To attain the main object, a first semiconductor integrated circuit device according to the present invention comprises a fuse area; a plurality of first layout sections disposed in the fuse area at a first repetition pitch, in each of which sections a fuse is laid out; a fuse latch circuit area; a plurality of second layout sections disposed in the fuse latch circuit area at a second repetition pitch smaller than the first repetition pitch, in each of which sections a fuse latch circuit corresponding to each of the fuses is laid out; and at least one third layout section disposed in a space created by the difference between the first and second repetition pitches, where at least one pattern which is unrepeatable in each of the plurality of second layout sections and at least one pattern which does not need to be repeated in each of the plurality of second layout sections is laid out.

In the first semiconductor integrated circuit device, at least one of a pattern which is unrepeatable in each second layout section and a pattern which does not need to be repeated in each second layout section is laid out in a third layout section. This arrangement removes, restrictions on layout in second layout sections or prevents patterns which do not need to be repeated from being repeated than necessary, thus allowing fuse latch circuit area to be minimized.

To attain the main object, a second semiconductor integrated circuit device according to the present invention comprises a fuse area; a plurality of first layout sections disposed in the fuse area at a first repetition pitch, in each of which sections a fuse is laid out; a fuse latch circuit area; and at least one second layout section disposed in the fuse latch circuit area, in which section n fuse latch circuits corresponding to the n fuses are laid out (n meets the inequality n>1).

In the second semiconductor integrated circuit device, fuse latch circuits which correspond to n fuses are disposed in second layout section. Because of this, in the second layout section, as many layout patterns as necessary such as patterns which cannot be repeated or do not need to be repeated for each fuse latch circuit have only to be provided for the fuse latch circuits corresponding to the n fuses. Thus compared with a case where the above-described patterns are formed for each fuse latch circuit, restrictions on layout in the second layout sections are reduced, thus allowing fuse latch circuit area to be minimized.

To attain the other object, a third semiconductor integrated circuit device according to the present invention comprises a fuse area and a plurality of layout sections disposed in the fuse area, in which sections a fuse is laid out, wherein the plurality of layout sections are disposed at irregular pitches in the fuse area.

In the third semiconductor integrated circuit device, the first layout sections in which fuses are laid out are laid out at irregular repetition pitches. For example, doing so allows blow errors to be reduced if regular pitches shift from the minimum positioning repetition pitch of a fuse blow machine.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a layout diagram, showing a layout of a semiconductor integrated circuit device according to a second embodiment of the present invention.

FIG. 15 is a layout diagram, showing a layout of a semiconductor integrated circuit device according to a ninth embodiment of the present invention.

DETAILED DESCRIPTION OF THE INVENTION

Figure 1:
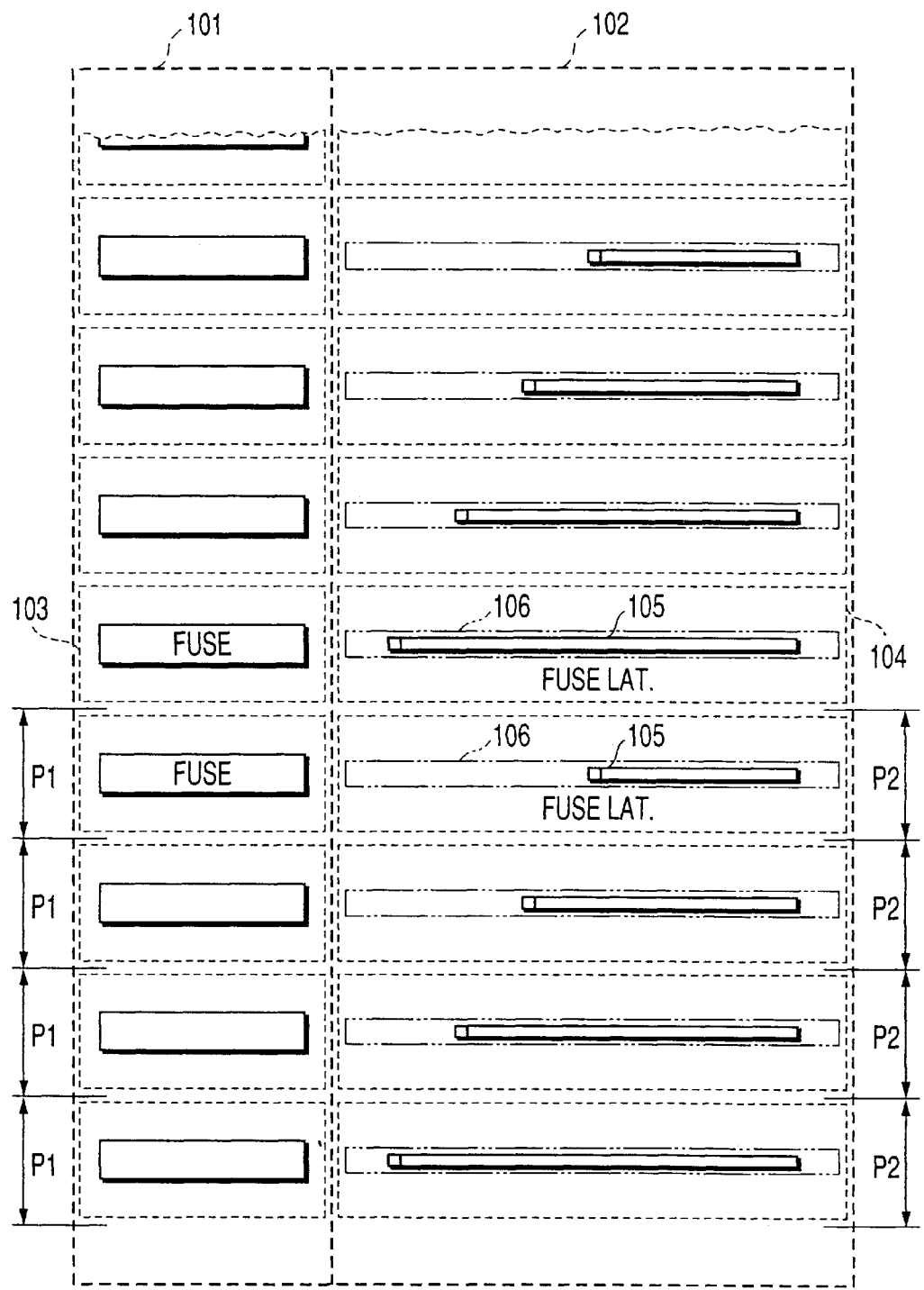
FIG. 1 is a layout diagram, showing a layout of a conventional semiconductor integrated circuit device.

Referring now to the drawings, the embodiments of the present invention are described below. In all drawings, like parts are given with like reference numerals.

First Embodiment

Figure 3:
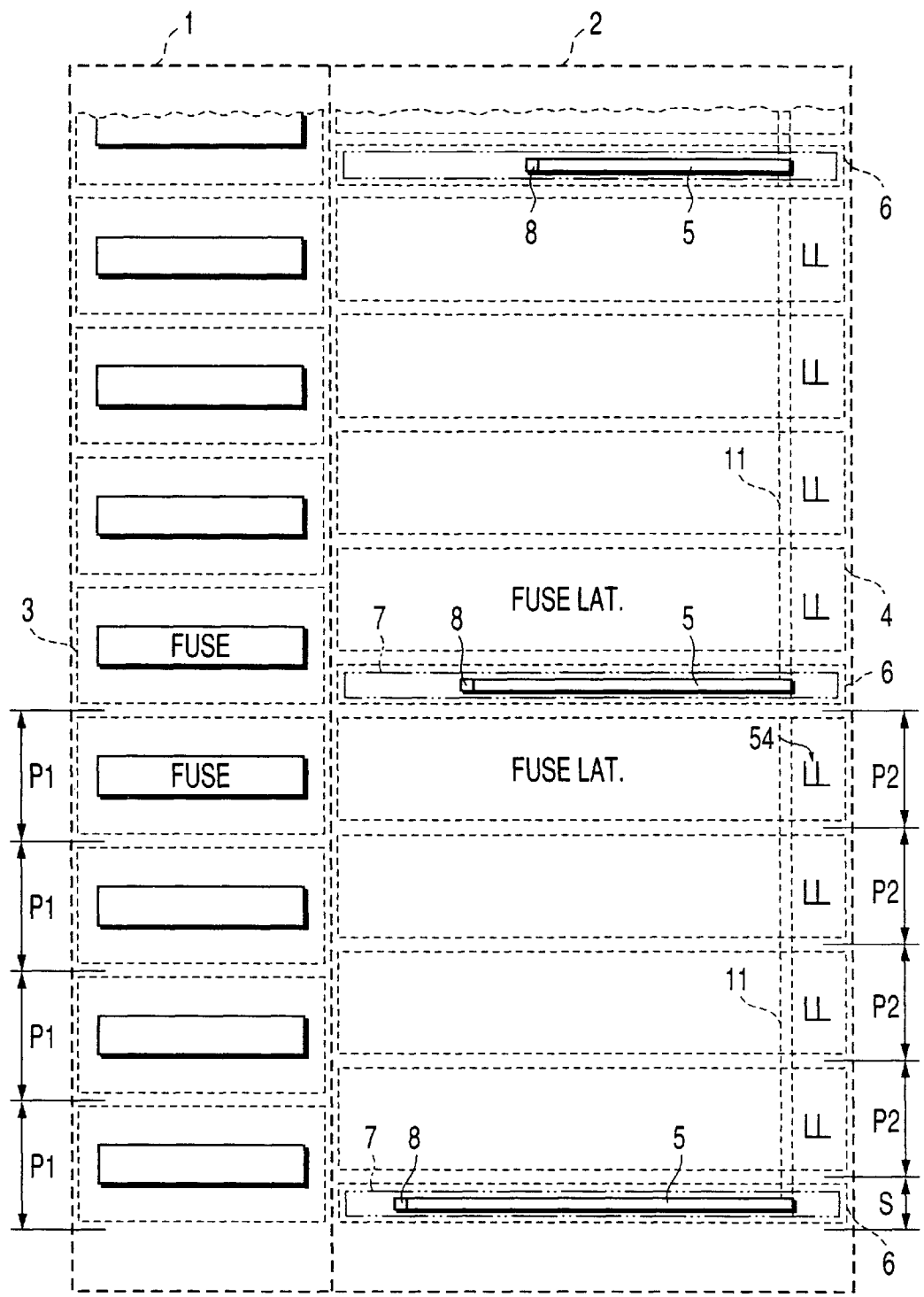
FIG. 3 is a layout diagram, showing a layout of a semiconductor integrated circuit device according to a first embodiment of the present invention.

FIG. 3 is a layout diagram shows a layout of a semiconductor integrated circuit device according to the first embodiment of the present invention. FIG. 3 shows an examples of fuses and fuse latch circuits, all of which are used for a redundancy circuit in semiconductor memory device.

As shown in FIG. 3, a plurality of fuses (FUSE) are disposed in a fuse area 1 provided on a chip. A basic pattern of fuses is laid out in a first layout section 3, which is repeated a predetermined number of times at a first repetition pitch P1 to dispose the predetermined number of fuses on the chip.

A fuse latch circuit area 2 is provided adjacent to the fuse area 1 on the chip. A plurality of fuse latch circuits (FUSE LAT.) are disposed in the fuse latch circuit area 2. A basic pattern of fuse latch circuits is laid out in a second layout section 4, which is repeated a predetermined number of times at a second repetition pitch P2 to dispose the predetermined number of fuse latch circuits on the chip.

Figures 4A, 4B:
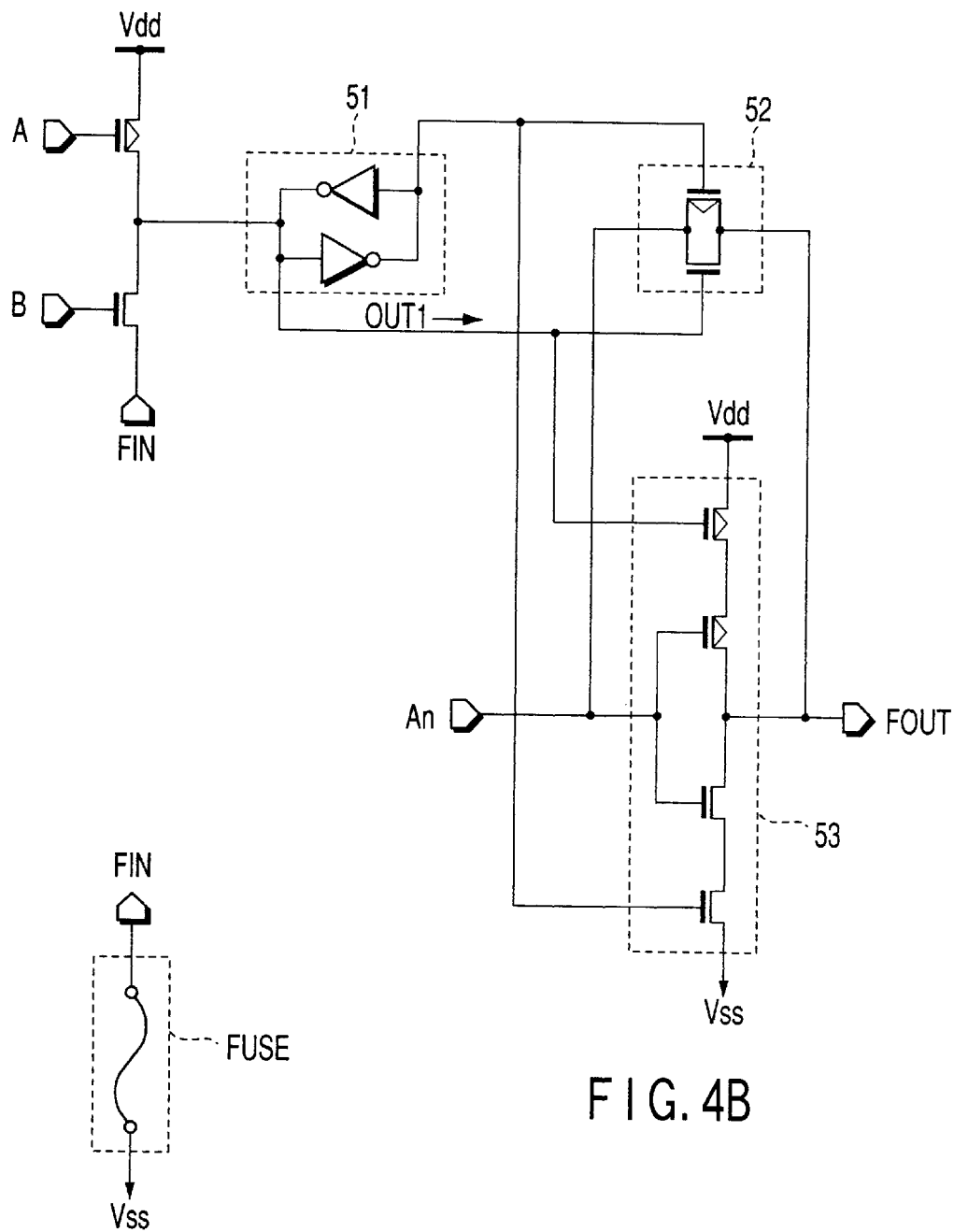
FIG. 4A a circuit diagram, showing an example of a fuse.
FIG. 4B is a circuit diagram, showing an example of a fuse latch circuit.

FIG. 4A is a circuit diagram shows a fuse, and FIG. 4B is a circuit diagram shows an example of a fuse latch circuit. The example in FIG. 4B is outlined below.

Signals A and B are intended to initialize the fuse latch circuit. The signal A is kept at a "LOW" level for a certain period after the power is turned on, and the signal B is kept at a "HIGH" level for a certain period after the signal A changes from the "LOW" to the "HIGH" level. Thus initializes output from a latch circuit 51. The output level is kept constant according to the state of the fuse in FIG. 4A; that is, whether the fuse is "blown" or "intact". If the fuse is "blown," output OUT1 from the latch circuit 51 is at the "HIGH" level, a transfer gate 52 is on, a clocked inverter 53 is off, and an output signal FOUT is at the same level of an address An. On the other hand, if the fuse is "intact", the output OUT1 from the latch circuit 51 is at the "LOW" level, the transfer gate 52 is off, the clocked inverter 53 is on, and the output signal FOUT is at the inverted level of the address An.

Figures 5A, 5B:
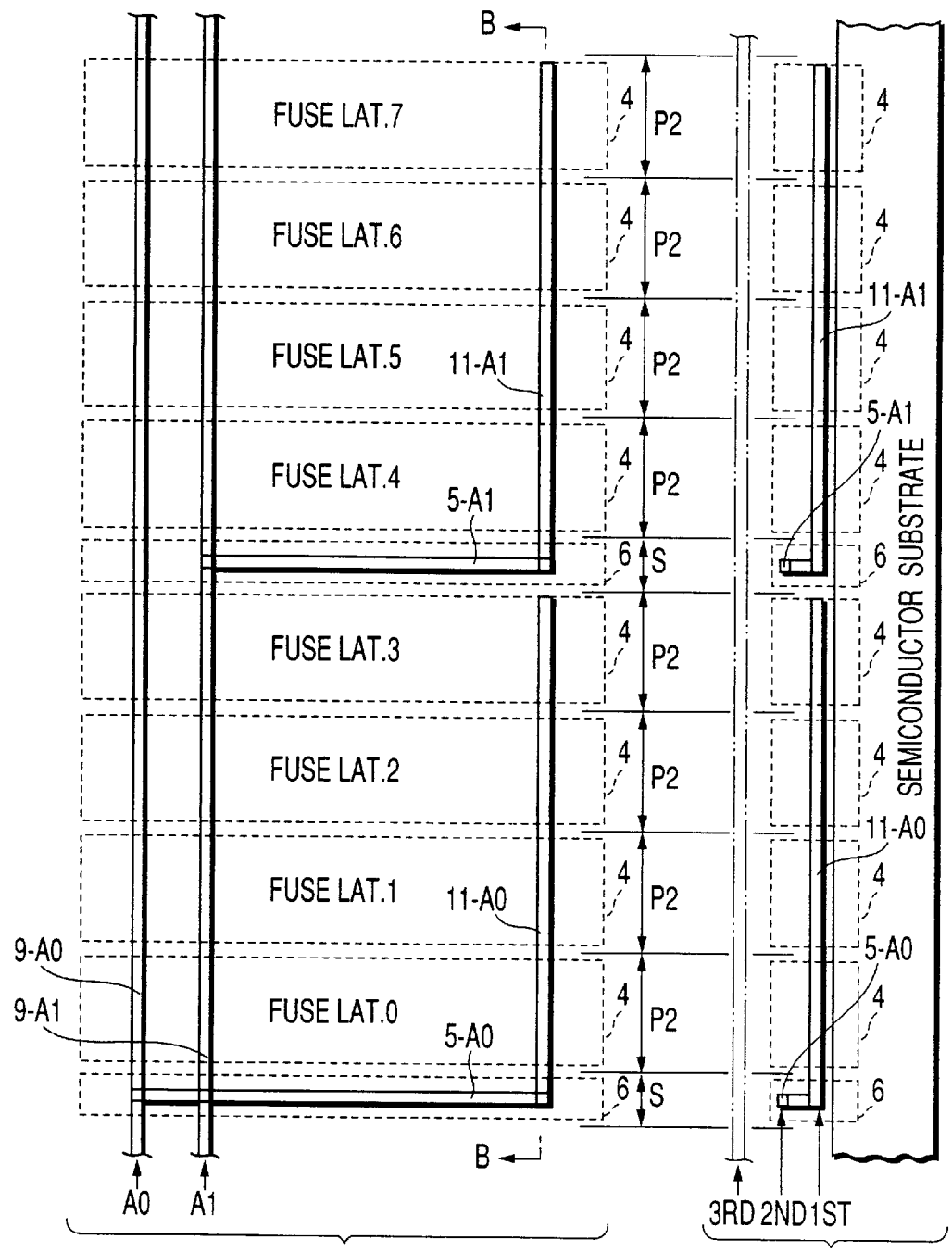
FIG. 5A shows the relationship between local address lines and global address lines.
FIG. 5B is a sectional view, taken along line B—B in FIG. 5A.

In the first embodiment, the second repetition pitch P2 is set smaller than the first repetition pitch P1, and a third layout section 6 is disposed in a space S created by the difference between the first and second pitches P1 and P2. An unrepeatable pattern of fuse latch circuits is laid out in the third layout section 6. The unrepeatable pattern is formed with wiring that feeds a signal to the fuse latch circuits, for example. For a fuse latch circuit used for the redundancy circuit in FIG. 3, the unrepeatable pattern is formed with local address signal lines 5. The local address signal lines 5 are disposed in a region 7 which region is provided in the third layout section 6. The local address signal lines 5 connect global address signal lines to their corresponding fuse latch circuits. The global address signal lines, for example, wires which extend in a direction crossing the local address lines 5, is disposed, for example, above the local address signal line 5. In the figure, a reference numeral 8 indicates a contact between the local address signal line 5 and the global address signal line. A reference numeral 11 indicates an address signal line in the basic pattern which connects the local address signal line 5 to the fuse latch circuit. FIG. 5A shows the relationship between the local address signal line 5 and the global address signal line.

As shown in FIG. 5A, a global address signal line 9-A0 through which an address A0 is transmitted connects to a local address signal line 5-A0 which crosses the global address signal line 9-A0. The local address signal line 5-A0 connects to, for example, an address signal line 11-A0 in the basic pattern which extends in a direction crossing the local address signal line 5-A0, for example, and is disposed, for example, below the local address signal line 5-A0. Thus the address A0 is supplied to fuse latch circuits (FUSE LAT. 0 through FUSE LAT. 3). Similarly, a global address signal line 9-A1 through which an address A1 is transmitted connects to a local address signal line 5-A1 which crosses the global address signal line 9-A1. The local address signal line 5-A1 connects to, for example, an address signal line 11-A1 in the basic pattern which extends in a direction crossing the local address signal line 5-A1, for example, and is disposed, for example, below the local address signal line 5-A1. Thus the address A1 is supplied to fuse latch circuits (FUSE LAT. 4 through FUSE LAT. 7).

FIG. 5B shows a cross sectional view, taken along line B—B in FIG. 5A.

As shown in FIG. 5B, address signal lines 11 (11-A0 and 11-A1) are formed with, for example, a first conductor layer (1ST) formed on a semiconductor substrate; local address signal lines 5 (5-A0 and 5-A1) are formed with, for example, a second conductor layer above the first conductor layer (2ND); and global address lines 9 is formed with, for example, a third conductor layer (3RD) above the second conductor layer.

In a semiconductor integrated circuit device according to the first embodiment, described above, the third layout section 6, in which the local address signal lines 5 are laid out, is separated from the second layout section 4, in which the basic pattern of fuse latch circuits is laid out. This increases the layout flexibility of a wiring which is provided using the same wiring layer as in the case of the local address lines 5.

Patterns which do not necessarily need to be repeated, such as well contacts, can be laid out in the third layout section 6, the patterns being described in detail for a third embodiment later. Thus well contacts can be eliminated from the second layout section 4.

Figure 2:
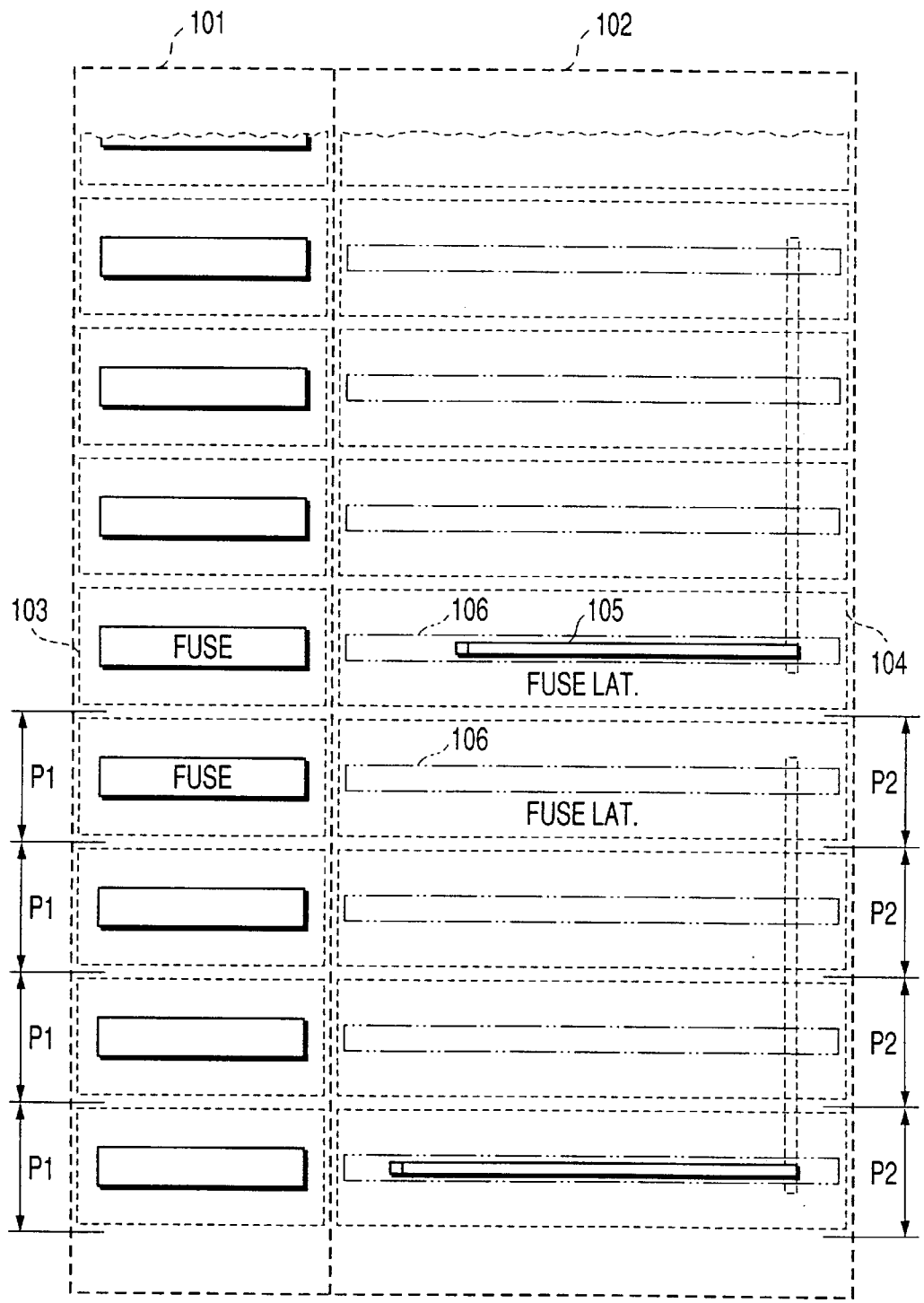
FIG. 2 is a layout diagram, showing a layout of another conventional semiconductor integrated circuit device.

Setting the repetition pitch P2 in the second layout section 4 smaller than the repetition pitch P2 in FIGS. 1 and 2 appears to increase a length of the second layout section 4 along with the local address signal line (longitudinal length) qualitatively. However, the flexibility of layout increases. Moreover, the second layout section 4 does not need a space 106 in FIGS. 1 and 2, which has thus far been needed, or well contacts. For this and other reasons, the longitudinal length can be reduced.

A reduction in the longitudinal length advantageously allows a local address signal line 5 to be shortened, thus reducing the parasitic capacity of address signal lines, including global and local signal lines.

The fuse is only connected to the fuse latch circuit using the wiring layer, the flexibility of connection of the fuse is high. That is, the difference between pitches P1 and P2 never makes it difficult to connect a fuse to a fuse latch circuit.

A modification of the first embodiment is described below.

Figure 6:
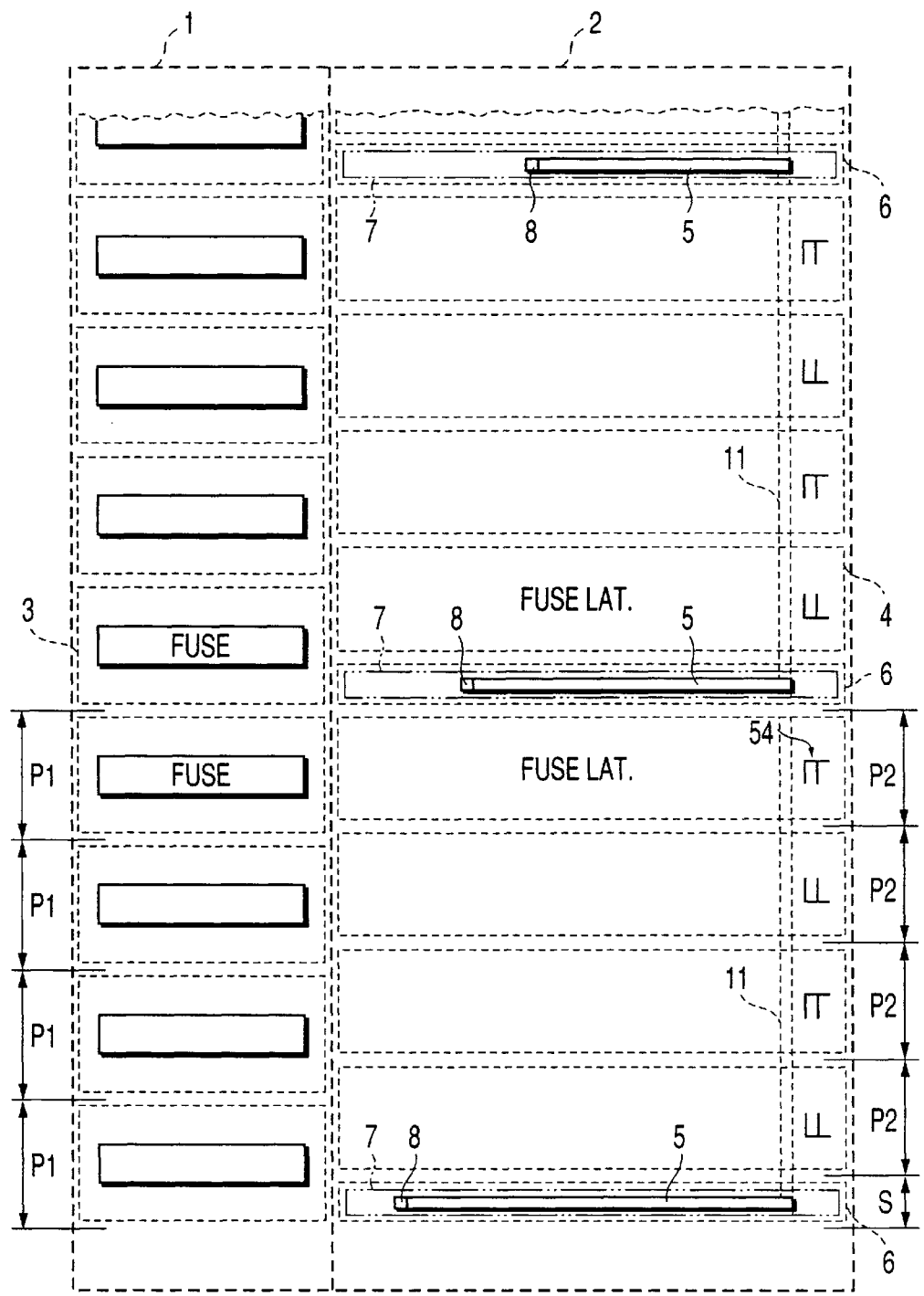
FIG. 6 is a layout diagram, showing a modification of the first embodiment.

FIG. 6 is a layout diagram showing the modification of the first embodiment.

In FIG. 6, the symbol indicated by a reference numeral 54 represents the direction of a fuse latch circuit laid out in the second layout section 4.

In the first embodiment in FIG. 3, all symbols 54 point the same direction. This, in turn, means that the basic patterns disposed in the second layout section 4 point the same direction.

On the other hand, in the modification of the first embodiment in FIG. 6, the symbols 54 alternately point the opposite directions. This, in turn, means that a preceding basic pattern and the following basic pattern in the second layout section 4 are like a mirror image of each other.

Indeed a preceding basic pattern and the following basic pattern disposed in the second layout section 4 may be like a mirror image of each other.

The direction of the basic patterns disposed in the second layout section 4 is permitted not to be the same as in the case of FIG. 3 or FIG. 6.

This modification is applicable to all embodiments describe below.

In the first embodiment and its modification, four fuse latch circuits correspond to the same address. If the number of fuse latch circuits corresponding to the same address increases, the difference in position between the first and second layout sections also increases accordingly. Because of this, the second pitch P2 can be brought close to the first pitch P1, or increased. Thus the longitudinal length of the second layout section 4 can be reduced, or the flexibility of layout in the second layout section 4 can be increased advantageously. The advantage becomes more considerable as the capacity of semiconductor memory increases, and more redundancy circuits are used.

Second Embodiment

FIG. 7 is a layout diagram showing a layout of a semiconductor integrated circuit device according to the second embodiment of the present invention. FIG. 7 shows an example of a fuse and a fuse latch circuit used for a redundancy circuit in semiconductor memory.

As shown in FIG. 7, the second embodiment differs from the first embodiment in that a third layout section 6' is disposed in a space S between fuse latch circuits which are next to each other and correspond to two different addresses.

The second embodiment produces the same effects as the first embodiment. In addition, the second embodiment further produces the following effects.

In the first embodiment, one local address signal line 5 is disposed in each third layout section 6.

On the other hand, two local address signal lines 5 are disposed in each third layout section 6', into which two third layout sections 6 are combined. Doing so allows the width of a third layout section 6' to be smaller than the sum of the widths of two third layout sections 6.

This is reasoned as follows. If one local address signal line 5 is disposed in a third layout section 6, a space is produced on either side of the local address signal line 5. Thus if two local address signal lines 5 are disposed, two spaces are produced on either side of each of the two local address lines; that is, a total of four spaces are produced. However, if two local address signal lines 5 are disposed in a third layout section 6', one space is produced each on one side of the two signal lines 5, and one space is produced between them; that is, a total of three spaces only are produced.

Because of this, the second pitch P2 can be brought close to the first pitch P1 in the second embodiment, compared with the first embodiment. Thus the longitudinal length of a second layout section 4 can be reduced, or the flexibility of layout in the second layout section 4 can be increased advantageously.

Third Embodiment

The third embodiment is a layout of fuses and fuse latch circuits to which the present invention applies.

Figure 8:
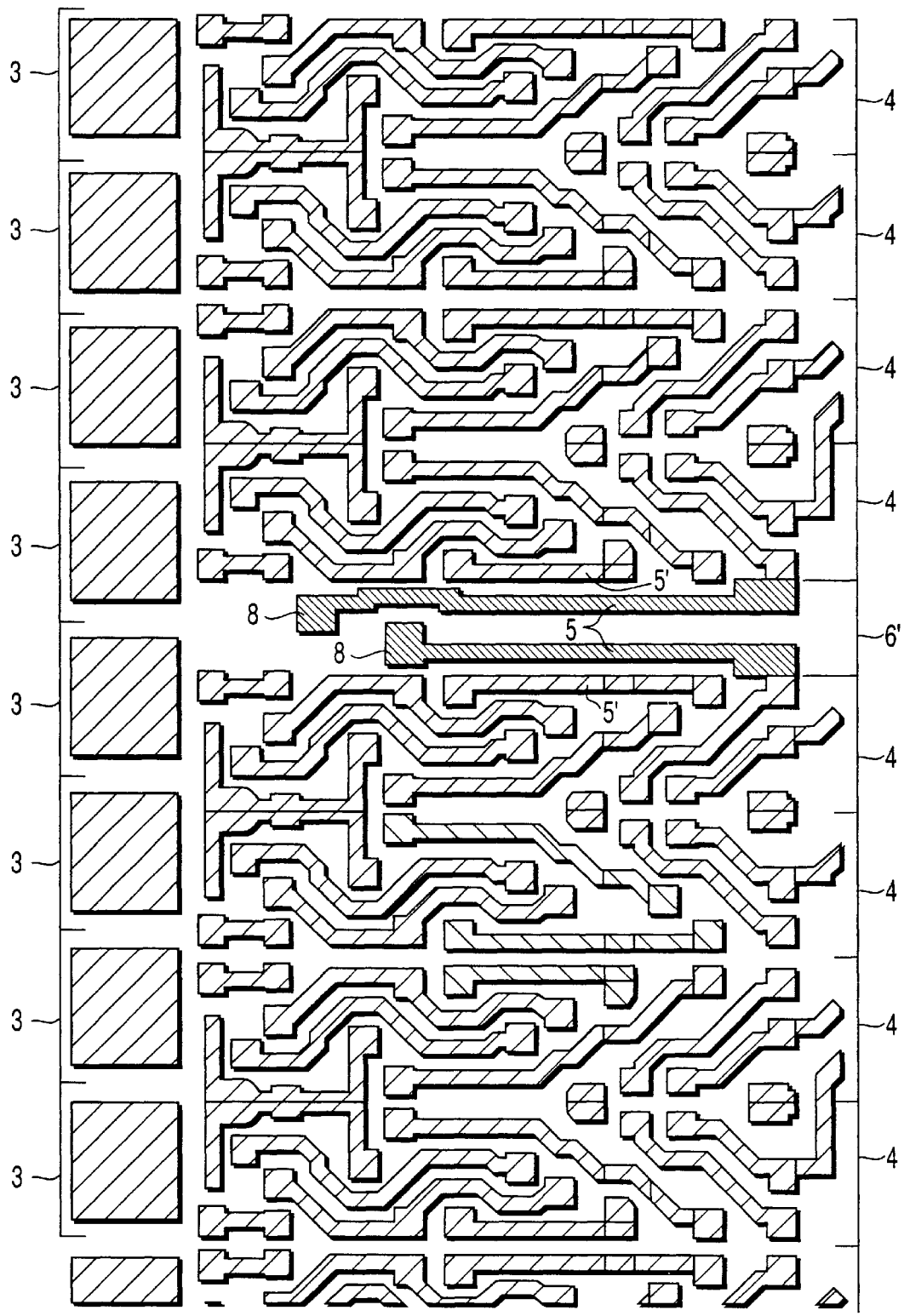
FIG. 8 is a layout diagram, showing a layout of a semiconductor integrated circuit device according to a third embodiment of the present invention.
Figure 9:
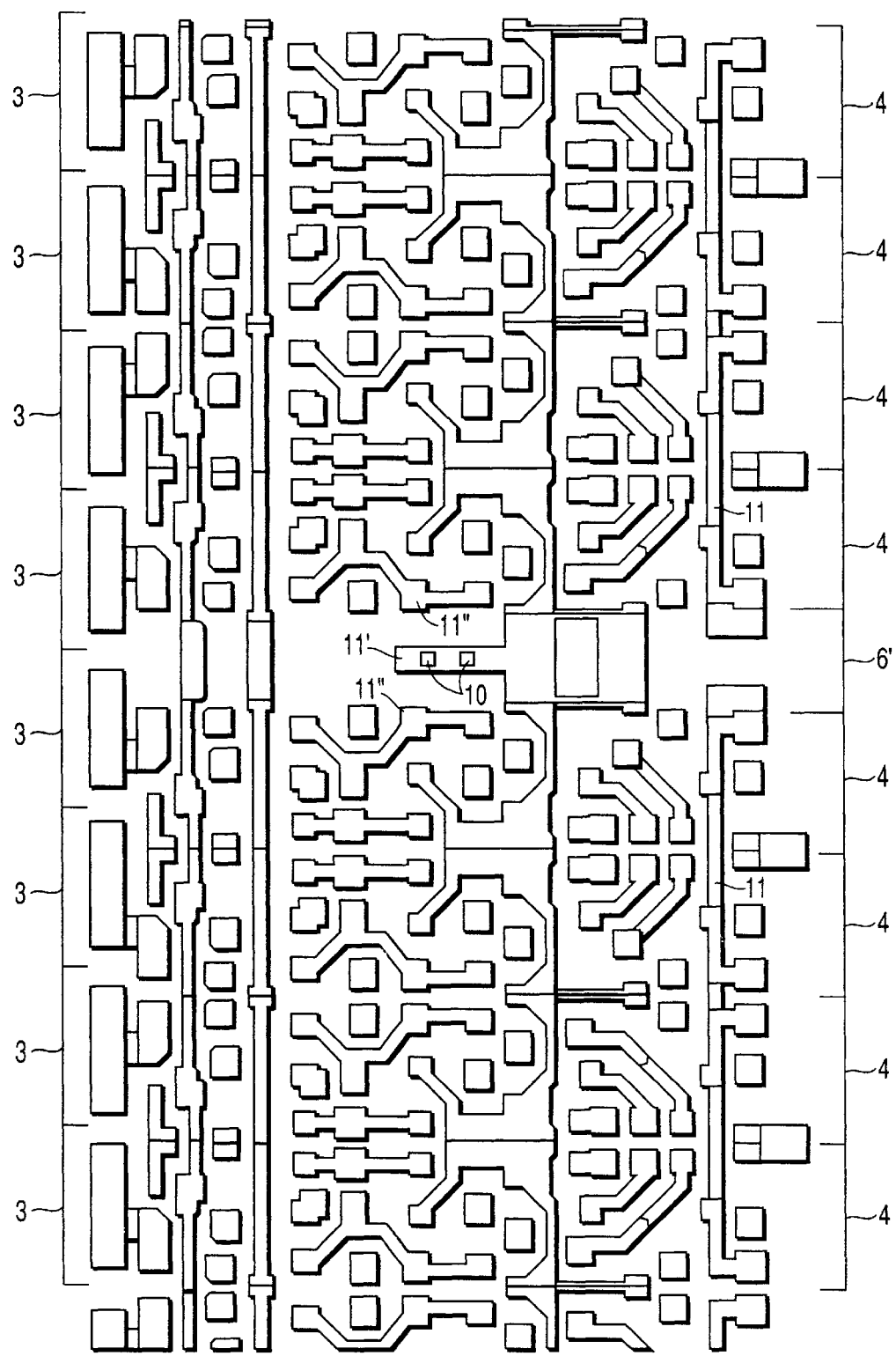
FIG. 9 is a layout diagram, showing a layout of a semiconductor integrated circuit device according to the third embodiment of the present invention.

FIGS. 8 and 9 are layouts of a semiconductor integrated circuit device according to the third embodiment of the present invention.

The layout in FIG. 8 according to the second embodiment is adapted so that two adjacent basic patterns of fuse latch circuits disposed in a second layout section 4 are like a mirror image of each other.

For the layout in FIG. 8, a local address signal line 5 is formed in a third layout section 6'. In a second layout section 4, wiring 5' is formed with the same conductor layer as the local address signal line 5. The wiring 5' connects MOSFETs, constituting a fuse latch circuit, to each other.

FIG. 9 shows a plane pattern in a wiring layer differing from the wiring layer in FIG. 8.

As shown in FIG. 9, another wiring pattern is formed under the wiring pattern in FIG. 8, and wiring 11' which applies a potential to a well is formed especially in a third layout section 6'. The wiring 11' is provided with a well contact 10 with a well in which an N-channel type MOSFET or a P-channel type MOSFET, constituting a fuse latch circuit, is formed.

An address signal line 11 in a basic pattern and wiring 11" formed with the same conductor layer as the wiring 11', applying a potential to a well, are provided in a second layout section 4. Like the wring 51, the wiring 11" connects MOSFETS, constituting a fuse latch circuit, to each other.

As described above, not only the local address signal line 5 but the wiring 11' to a well in which an N-channel type MOSFET or a P-channel type MOSFET, constituting a fuse latch circuit, is formed and the well contact 10 may be formed in a third layout section 6'. A pattern consisting of the wiring 11' and well contacts 10 does not necessarily need to be repeated for each fuse latch circuit.

Disposing the wiring 11' and well contacts 10 in a third layout section 6' as described above prevents a pattern which does not necessarily need to be repeated from being repeated, thus suppressing an increase in the area of a fuse latch circuit more effectively.

Fourth Embodiment

Figure 10:
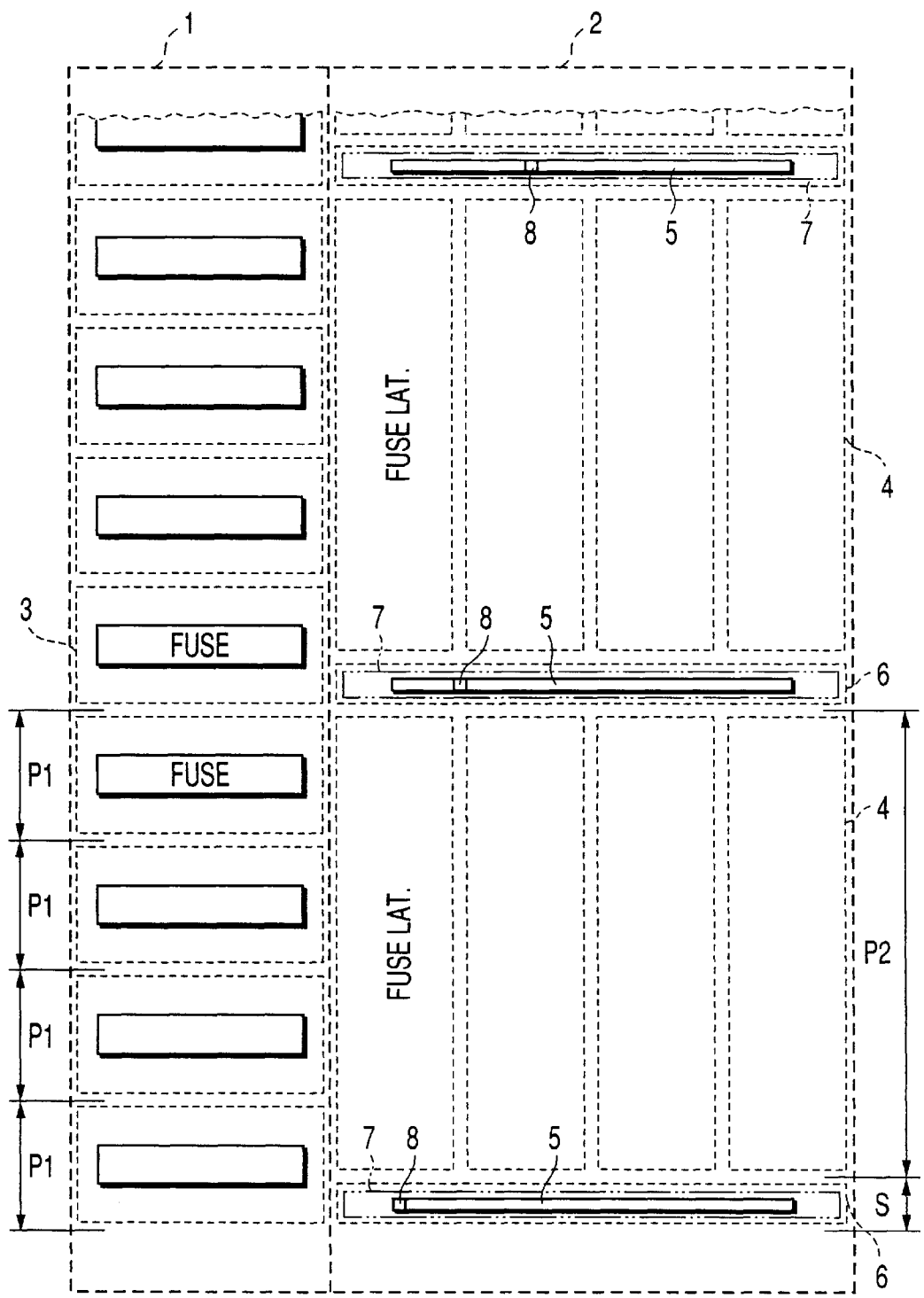
FIG. 10 is a layout diagram, showing a layout of a semiconductor integrated circuit device according to a fourth embodiment of the present invention.

FIG. 10 is a layout diagram showing a layout of a semiconductor integrated circuit device according to the fourth embodiment of the present invention. FIG. 10 shows an example of a fuse and a fuse latch circuit used for a redundancy circuit in semiconductor memory device.

As shown in FIG. 10, the fourth embodiment differs from the first embodiment in terms of the direction of fuse latch circuit disposition. In the first embodiment, a second layout section 4 is disposed in the same direction as a first layout section 3. On the other hand, in the fourth embodiment, a second layout section 4 is turned 90° so that the direction in which the second layout section 4 is disposed crosses that in which a first layout section 3 is disposed. In the fourth embodiment also, four second layout sections 4 are turned 90° at a time.

In this case, the second repetition pitch P2 is larger than the first repetition pitch P1. Specifically, the second repetition pitch P2 is less than four times the first repetition pitch P1. In the fourth embodiment, a third layout section 6 is disposed in the space S created by the difference between the first repetition pitch P1 multiplied by four and the second repetition pitch P2.

The fourth embodiment produces the same effects as the first embodiment.

Fifth Embodiment

Figure 11:
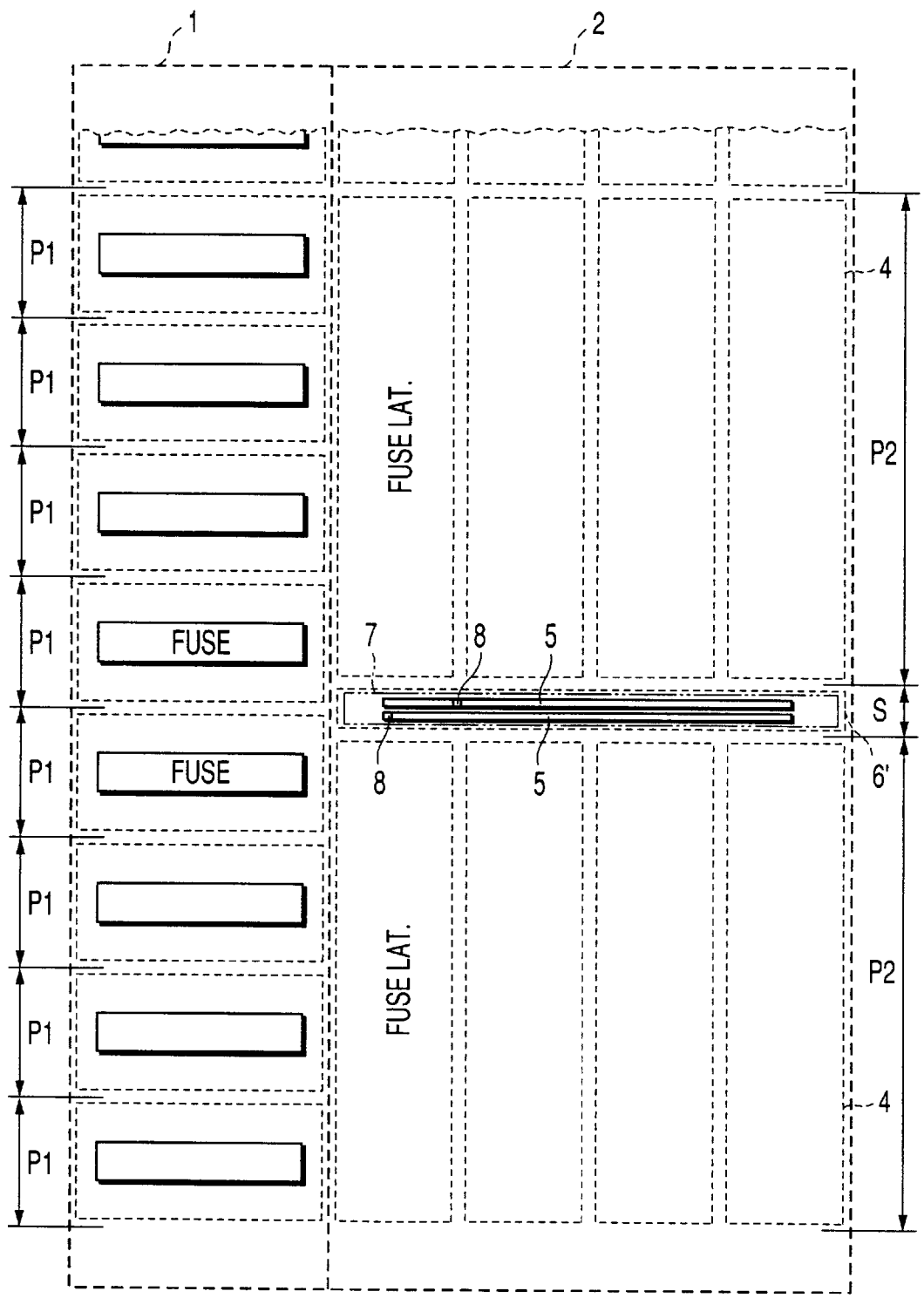
FIG. 11 is a layout diagram, showing a layout of a semiconductor integrated circuit device according to a fifth embodiment of the present invention.

FIG. 11 is a layout diagram showing a layout of a semiconductor integrated circuit device according to the fifth embodiment of the present invention. FIG. 11 shows an example of a fuse and a fuse latch circuit used for a redundancy circuit in semiconductor memory.

As shown in FIG. 11, the fifth embodiment is an application of the fourth embodiment to the second embodiment. The fifth embodiment produces the same effects as the second embodiment.

Sixth Embodiment

Figure 12:
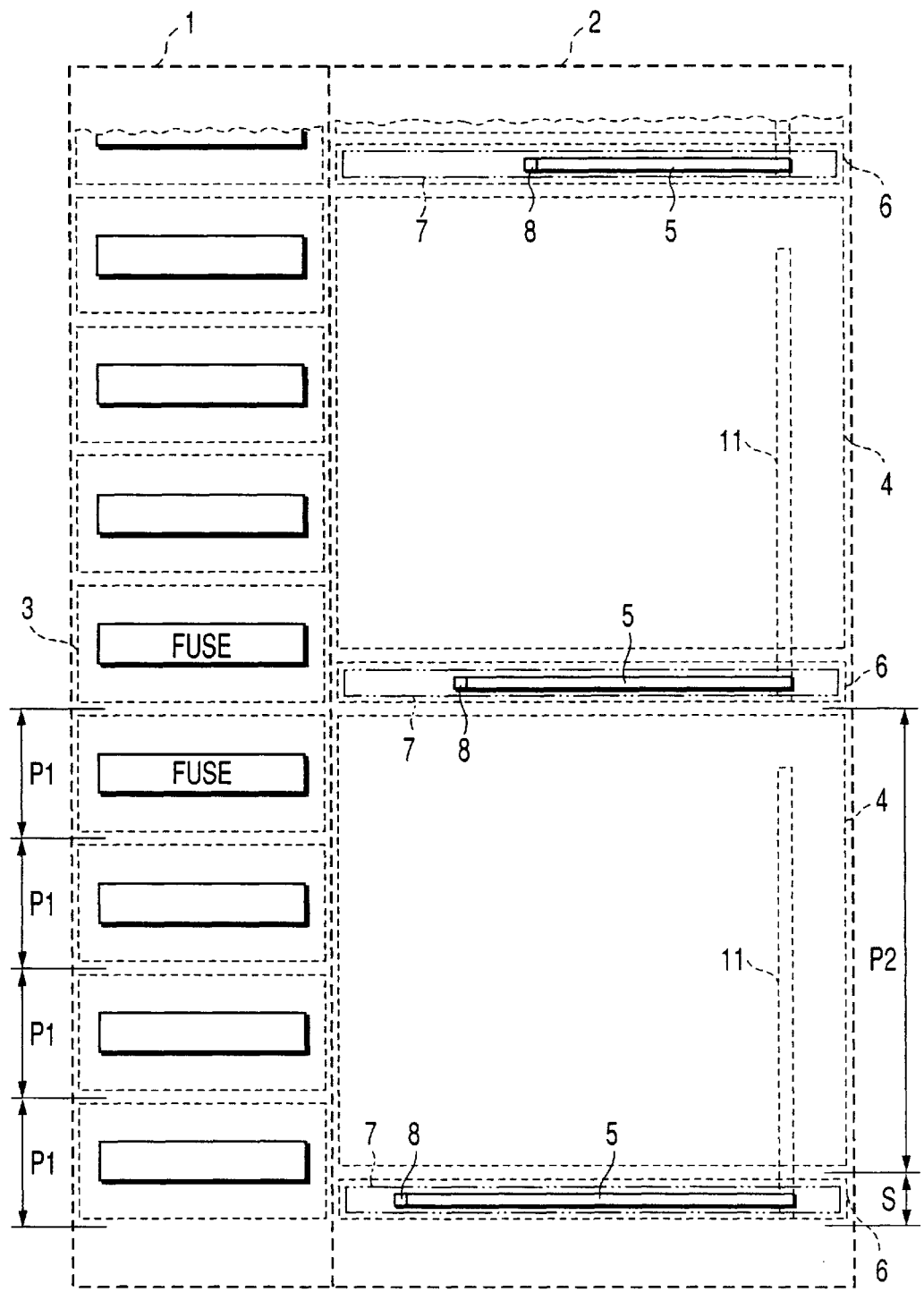
FIG. 12 is a layout diagram, showing a layout of a semiconductor integrated circuit device according to a sixth embodiment of the present invention.

FIG. 12 is a layout diagram showing a layout of a semiconductor integrated circuit device according to the sixth embodiment of the present invention. FIG. 12 shows an example of a fuse and a fuse latch circuit used for a redundancy circuit in semiconductor memory.

As shown in FIG. 12, in the sixth embodiment, a basic pattern, for example, a combination of four fuse latch circuits, is disposed in a second layout section 4. A third layout section 6 is disposed in the space S created by the difference between the first repetition pitch P1 multiplied by four and the second repetition pitch P2.

The sixth embodiment produces the same effects as the first embodiment.

Furthermore, using a combination of four fuse latch circuits as a basic pattern increases the degree of layout flexibility, the area of a second layout section 4 can be made smaller, compared with the first embodiment.

In FIG. 12, the second pitch P2 is larger than the first pitch P1. However, using a combination of a plurality of fuse latch circuits corresponding to a plurality of fuses as a basic pattern allows the second pitch P2 to be set smaller than the first pitch PI. Such a modification can be applied to the seventh, eighth, and ninth embodiments, described below.

Seventh Embodiment

Figure 13:
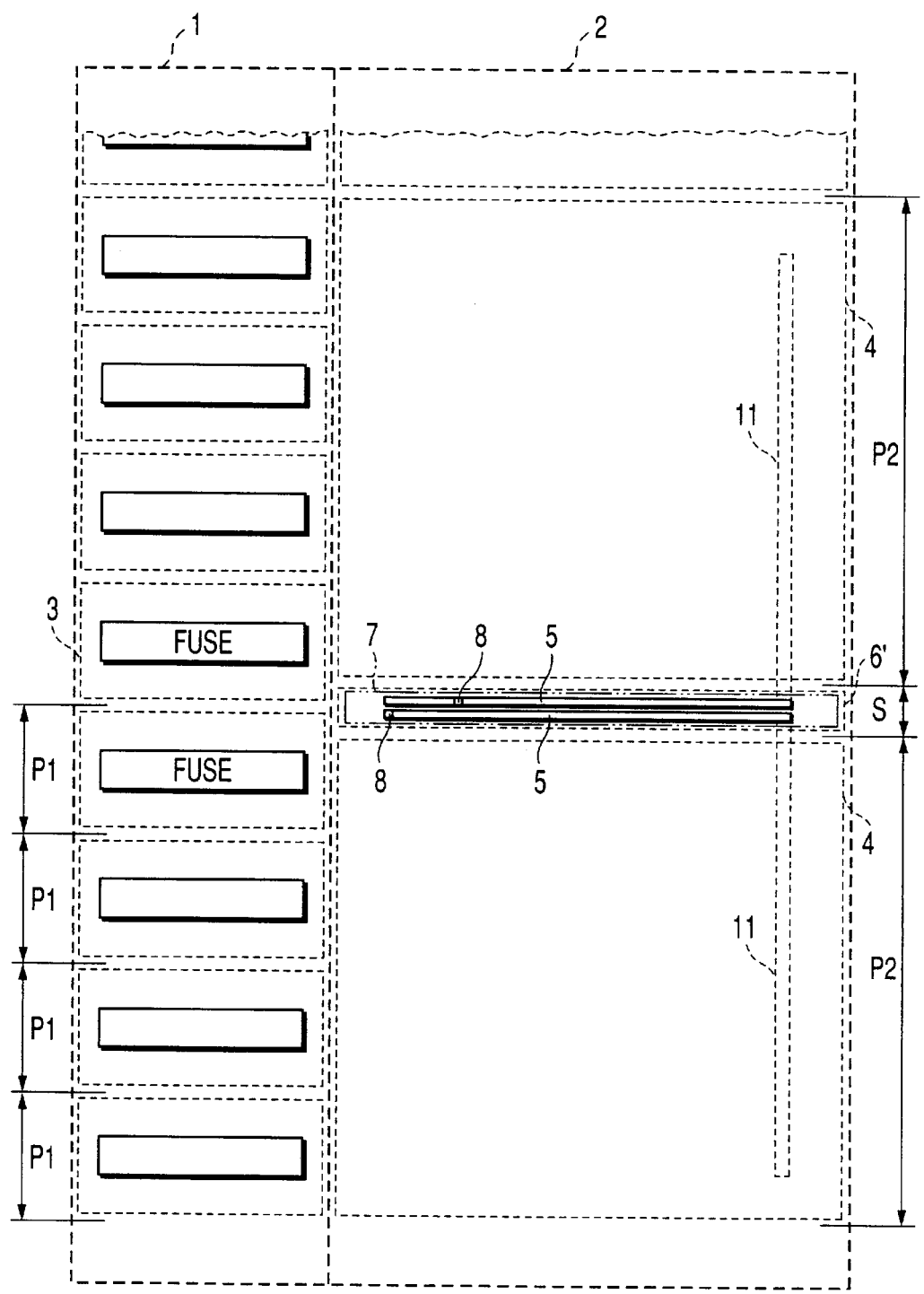
FIG. 13 is a layout diagram, showing a layout of a semiconductor integrated circuit device according to a seventh embodiment of the present invention.

FIG. 13 is a layout diagram showing a layout of a semiconductor integrated circuit device according to the seventh embodiment of the present invention. FIG. 13 shows an example of a fuse and a fuse latch circuit used for a redundancy circuit in semiconductor memory.

As shown in FIG. 13, in the seventh embodiment, a basic pattern, for example, a combination of four fuse latch circuits corresponding to four fuses, is disposed in a second layout section 4. A third layout section 61 is disposed in the space S between fuse latch circuits corresponding to two different addresses, which space is created by the difference between the first repetition pitch P1 multiplied by four and the second repetition pitch P2.

The seventh embodiment produces the same effects as the second embodiment.

Furthermore, a combination of four fuse latch circuits is used as a basic pattern, the flexibility of layout can be increased as is the case with the sixth embodiment. Thus the area of a second layout section 4 can be made smaller, compared with the second embodiment.

Eighth Embodiment

Figure 14:
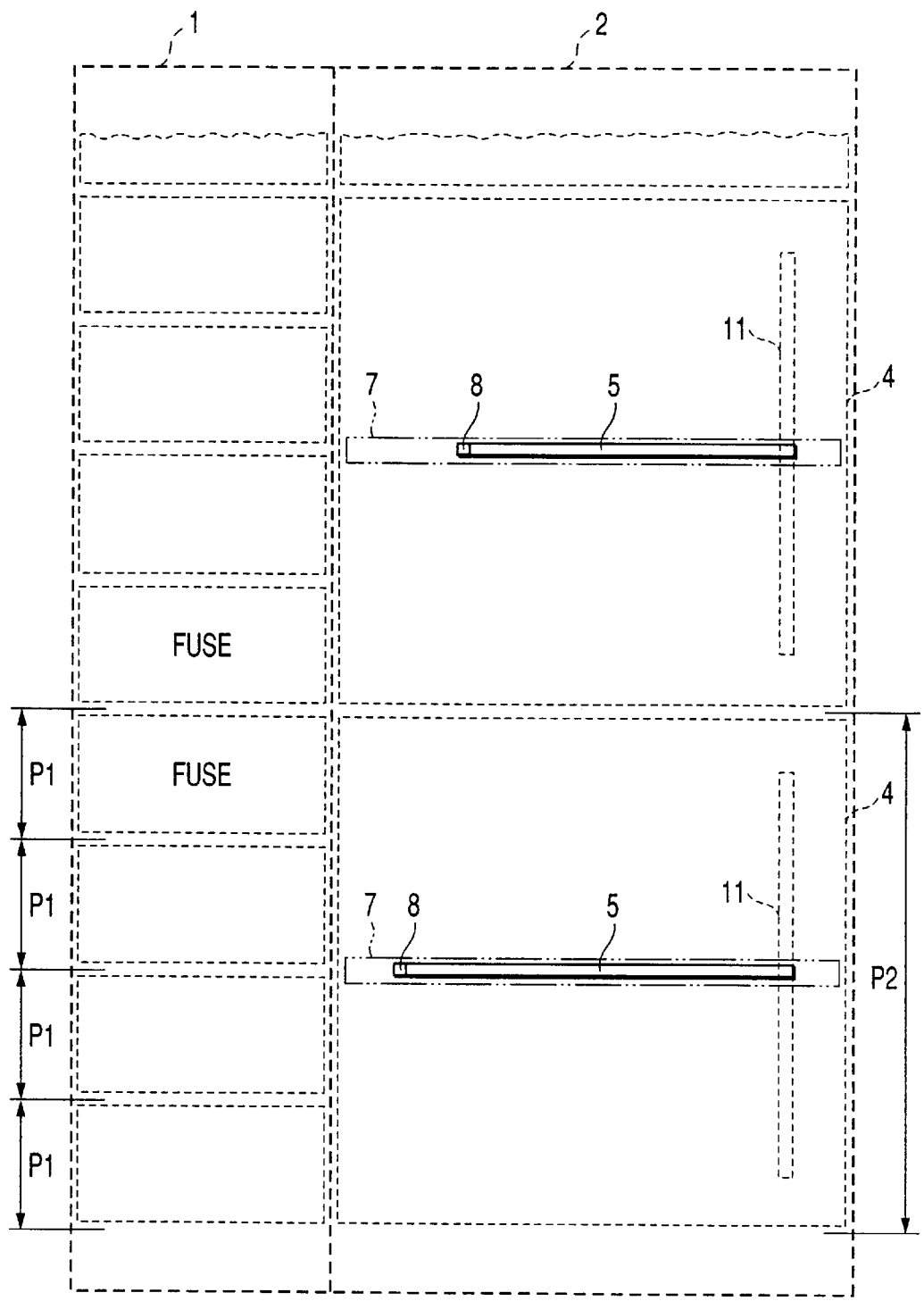
FIG. 14 is a layout diagram, showing a layout of a semiconductor integrated circuit device according to an eighth embodiment of the present invention.

FIG. 14 is a layout diagram showing a layout of a semiconductor integrated circuit device according to the eighth embodiment of the present invention. FIG. 14 shows an example of a fuse and a fuse latch circuit used for a redundancy circuit in semiconductor memory.

As shown in FIG. 14, in the eighth embodiment, a basic pattern, for example, a combination of four fuse latch circuits corresponding to four fuses, is disposed in a second layout section 4. The eighth embodiment differs from the six and seventh embodiments in that a third layout section 7 is disposed in a second layout section 4. In this case, the second repetition pitch P2 is an integral multiple of the first repetition pitch P1.

The eighth embodiment is not adapted so that a third layout section 6 is disposed in the space S created by the difference between the first repetition pitch P1 multiplied by four and the second repetition pitch P2. However, for four fuse latch circuits, the eighth embodiment needs only one space (or area) for disposing a pattern which cannot be repeated or is not required to be repeated for each fuse latch circuit. Thus the eighth embodiment produces the same effects as the sixth and seventh embodiments.

Ninth Embodiment

FIG. 15 is a layout diagram showing a layout of a semiconductor integrated circuit device according to the ninth embodiment of the present invention. FIG. 15 shows an example of a fuse and a fuse latch circuit used for a redundancy circuit in semiconductor memory.

As shown in FIG. 15, the ninth embodiment differs from the first through eighth embodiments in that fuse latch circuit areas 2R and 2L are disposed on either side of a fuse area 1. A fuse latch circuit (FUSE LAT.) corresponding to two fuses (FUSE) is disposed in each of the fuse latch circuit areas 2R and 2L.

Incorporating the arrangement of the first embodiment into a semiconductor integrated circuit laid out in such a manner allows the same effects as in the case of the first embodiment to be produced.

As shown in FIG. 15, the second pitch P2 may be larger than the first pitch P1. However, the second pitch P2 can be made smaller than the first pitch P1.

As shown in FIG. 15 also, the length crossing the direction in which a second layout section 4 is disposed can be reduced if the second pitch P2 is larger than the first pitch P1. The arrangements of the second to eighth embodiments can be incorporated into the ninth embodiment, which has been described above according to the first embodiment.

Tenth Embodiment

The tenth embodiment is adapted to arrange a plurality of fuses in series at irregular pitches.

A plurality of fuses have thus far been arranged in series, with the center of each fuse positioned at a distance of nX $\mu$m from the center of a certain fuse as an origin, where X $\mu$m is the pitch between adjacent fuses, and n is an integer. The positioning accuracy of a fuse blow machine (for example, a laser blow machine) can be inadequate relative to the fuse pitch if it becomes progressively smaller in the future.

Figures 16, 17:
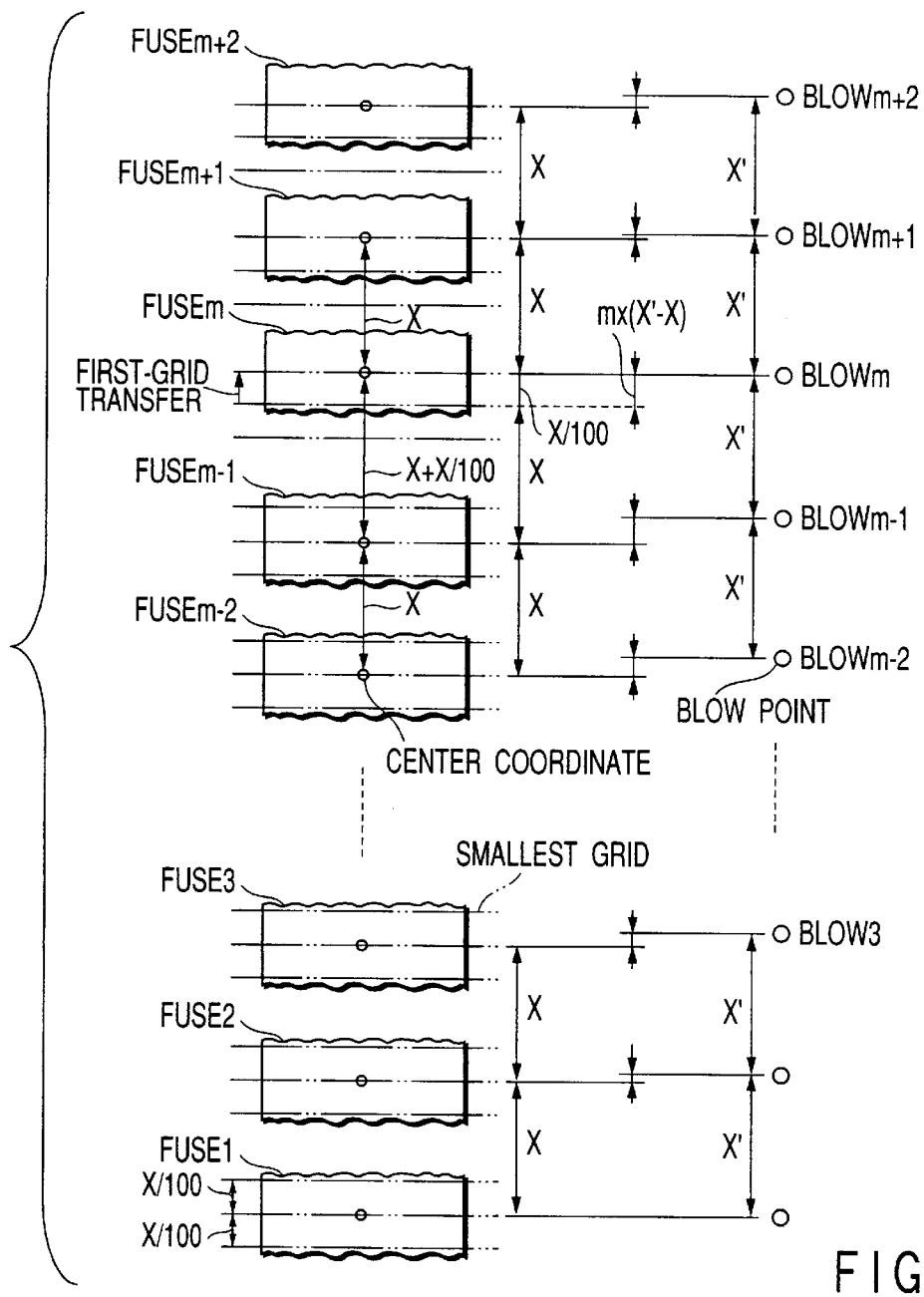
FIG. 16 is a layout diagram, showing a layout of a semiconductor integrated circuit device according to a tenth embodiment of the present invention.
FIG. 17 is a diagram, showing how to determine a fuse coordinate according to an eleventh embodiment of the present invention.

FIG. 16 is a layout of a semiconductor integrated circuit device according to the present invention.

As shown in FIG. 16, the pitch between fuses (FUSE1 through FUSEm+2) and the minimum grid (the smallest point for layout) are assumed to be X $\mu$m and X/100 $\mu$m. The minimum pitch for positioning blow points (BLOW0 through BLOWm+2) is X' $\mu$m, a little larger than X $\mu$m.

In this case, the difference between the fuse center coordinate and blow point coordinate increases by (X'–X) $\mu$m every time the next fuse is reached. When the difference mx(X'–X) is equal to X/100 $\mu$m, with the m-th fuse is reached, the m-th fuse should be moved one grid to equalize the coordinate of its center to that of the m-th blow point.

Doing so allows the positioning accuracy of a fuse blow machine to be supplemented and the possibility of a blow error due to coordinate difference to be reduced.

In the above descriptions, the minimum positioning pitch is assumed to be X' $\mu$m. The minimum positioning pitch may be considered to be a pitch which depends on laser shot accuracy required to prevent damage to adjacent fuses when a fuse is blown.

Eleventh Embodiment

Like the tenth embodiment, the eleventh embodiment is adapted to arrange a plurality of fuses in series at irregular pitches.

FIG. 17 illustrates how to determine a fuse coordinate according to the eleventh embodiment of the present invention.

As shown in FIG. 17, fuse coordinates are assumed to be arranged at a pitch of 1.25 $\mu$m, and the lowest place of a value which represents the position of a blow point specified by a blow machine is assumed to be 0.1 $\mu$m. In this case, 1.2 $\mu$m or 1.3 $\mu$m must be specified for a coordinate 1.25 $\mu$m. This causes a difference between the coordinate and the specified value. To prevent the difference, the fuse coordinate is corrected to 1.2 $\mu$m or 1.3 $\mu$m, taking the accuracy of the blow machine into accounts before a value is specified for the coordinate.

No problem arises if the fuse pitch can be set to 1.2 $\mu$m. However, in some cases, the pitch cannot be set to 1.2 $\mu$m because of strict layout conditions for fuse latch circuits; in other cases, as many fuses as necessary cannot be arranged at a relatively large pitch in a limited area. If a redundancy circuit layout is repeatedly used for several generations, design data can be scaled down by a scaling factor. The factor often causes the number in the lowest place of a fuse coordinate to be smaller than the number in the lowest place of a value which represents the position of a specified blow point.

Even in such a case, the eleventh embodiment allows the positioning accuracy of a blow machine to be supplemented, so that the possibility of a blow error due to coordinate difference can be reduced.

As described above, the present invention provides a semiconductor integrated circuit device that allows restrictions for fuse latch circuit layout to be removed and the area of a fuse latch circuit to be minimized. The present invention also provides a semiconductor integrated circuit device that allows blow errors to be reduced even if the pitch of repetition of a basic pattern for a fuse is reduced to below the minimum positioning repetition pitch of a blow machine.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a fuse area;
   a plurality of first layout sections disposed in the fuse area at a first repetition pitch, in each of which sections a fuse is laid out;
   a fuse latch circuit area;
   a plurality of second layout sections disposed in the fuse latch circuit area at a second repetition pitch smaller than the first repetition pitch, in each of which sections a fuse latch circuit corresponding to each of the fuses is laid out; and
   at least one third layout section disposed in a space created by the difference between the first and second repetition pitches, where at least one of a pattern which is unrepeatable in each of the plurality of second layout sections and a pattern which does not need to be repeated in each of the plurality of second layout sections is laid out.

2. The semiconductor integrated circuit device according to claim 1, wherein the relationship among the first and second repetition pitches and the space is expressed by the following:

$$n \times P1 = n \times P2 + S$$

(where n is an integer which meets the inequality n>1, P1 is the first repetition pitch, P2 is the second repetition pitch, and S is the space).

3. The semiconductor integrated circuit device according to claim 2, wherein at least one of a wiring for feeding a signal to the fuse latch circuit and a contact to a semiconductor substrate in which the fuse latch circuit is formed is laid out in the third layout section.

4. The semiconductor integrated circuit device according to claim 2, wherein the fuse and fuse latch circuit are used for a redundancy circuit in a semiconductor memory device, and further comprising:
   a plurality of global address wirings disposed in the direction in which the second layout sections are repeated; and
   at least one address wiring disposed in the third layout section, the at least one address wiring connects at least one of the plurality of global address wirings to the corresponding fuse latch circuit.

5. The semiconductor integrated circuit device according to claim 4, wherein the third layout section is between two of the fuse latch circuits which are adjacent to each other and correspond to two different addresses.

6. The semiconductor integrated circuit device according to claim 1, wherein at least one of a wiring for feeding a signal to the fuse latch circuit and a contact to a semiconductor substrate on which the fuse latch circuit is formed is laid out in the third layout section.

7. The semiconductor integrated circuit device according to claim 1, wherein the fuse and fuse latch circuit are used for a redundancy circuit in a semiconductor memory device, and further comprising:
   a plurality of global address wirings disposed in the direction in which the second layout sections are repeated; and
   at least one address wiring disposed in the third layout section, the at least one address wiring connects at least one of the plurality of global address wirings to the corresponding fuse latch circuit.

8. The semiconductor integrated circuit device according to claim 7, wherein the third layout section is between two of the fuse latch circuits which are adjacent to each other and correspond to two different addresses.

9. A semiconductor integrated circuit device comprising;
   a fuse area;
   a plurality of first layout sections disposed in the fuse area at a first repetition pitch, in each of which sections a fuse is laid out;
   a fuse latch circuit area; and
   at least one second layout section disposed in the fuse latch circuit area, in which section n fuse latch circuits corresponding to the n fuses are laid out (n meets the inequality n>1).

10. The semiconductor integrated circuit device according to claim 9, wherein the second layout sections are disposed at the second repetition pitch larger than the first repetition pitch in the fuse latch circuit area.

11. The semiconductor integrated circuit device according to claim 10, wherein the second repetition pitch is an integral multiple of the first repetition pitch.

12. The semiconductor integrated circuit device according to claim 10, wherein the second repetition pitch is smaller than the first repetition pitch multiplied by n, and further comprising:
    a third layout section disposed in a space created by the difference between the first repetition pitch multiplied by n and the second repetition pitch, in which section at least one of a pattern which is unrepeatable in each of the plurality of second layout sections and a pattern which does not need to be repeated in each of the plurality of second layout sections is laid out.

13. The semiconductor integrated circuit device according to claim 12, wherein the relationship among the first and second repetition pitches and the space is expressed by the following:

$$n \times P1 = P2 + S$$

(where P1 is the first repetition pitch, P2 is the second repetition pitch, and S is the space).

14. The semiconductor integrated circuit device according to claim 13, wherein at least one of a wiring for feeding a signal to the fuse latch circuit and a contact to a semiconductor substrate in which the fuse latch circuit is formed is laid out in the third layout section.

15. The semiconductor integrated circuit device according to claim 13, wherein the fuse and fuse latch circuit are used for a redundancy circuit in a semiconductor memory device, and further comprising:
    a plurality of global address wirings disposed in the direction in which the second layout sections are repeated; and
    at least one address wiring disposed in the third layout section, the at least one address wiring connects at least one of the plurality of global address wirings to the corresponding fuse latch circuit.

16. The semiconductor integrated circuit device according to claim 15, wherein the third layout section is between two of the fuse latch circuits which are adjacent to each other and correspond to two different addresses.

17. The semiconductor integrated circuit device according to claim 12, wherein at least one of a wiring for feeding a signal to the fuse latch circuit and a contact to a semiconductor substrate in which the fuse latch circuit is formed is laid out in the third layout section.

18. The semiconductor integrated circuit device according to claim 12, wherein the fuse and fuse latch circuit are used for a redundancy circuit in a semiconductor memory device, and further comprising:

a plurality of global address wirings disposed in the direction in which the second layout sections are repeated; and at least one address wiring disposed in the third layout section, the at least one address wiring connects at least one of the plurality of global address wirings to the corresponding fuse latch circuit.

* * * * *

UNITED STATES PATENT AND TRADEMARK OFFICE
CERTIFICATE OF CORRECTION

PATENT NO.    : 6,272,061 B1
DATED         : August 7, 2001
INVENTOR(S)   : Daisuke Kato et al.

It is certified that error appears in the above-identified patent and that said Letters Patent is hereby corrected as shown below:

<u>Column 12, claim 9,</u>
Line 25, before "n fuses" delete "the".

Signed and Sealed this

Nineteenth Day of March, 2002

Attest:

JAMES E. ROGAN
*Attesting Officer*    *Director of the United States Patent and Trademark Office*